(12) United States Patent
Ho

(10) Patent No.: US 9,955,584 B2
(45) Date of Patent: Apr. 24, 2018

(54) STAMP FOR PRINTED CIRCUIT PROCESS AND METHOD OF FABRICATING THE SAME AND PRINTED CIRCUIT PROCESS

(71) Applicant: Winbond Electronics Corp., Taichung (TW)

(72) Inventor: Yu-Hsuan Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/136,999

(22) Filed: Apr. 25, 2016

(65) Prior Publication Data

US 2017/0311452 A1    Oct. 26, 2017

(51) Int. Cl.
*H05K 3/12*      (2006.01)
*H05K 3/00*      (2006.01)
*H05K 3/10*      (2006.01)

(52) U.S. Cl.
CPC ......... *H05K 3/1258* (2013.01); *H05K 3/0044* (2013.01); *H05K 3/103* (2013.01); *H05K 2203/0108* (2013.01)

(58) Field of Classification Search
CPC .... H05K 3/1258; H05K 3/0044; H05K 3/103; H05K 2203/0108; H05K 13/0015
See application file for complete search history.

(56) References Cited

U.S. PATENT DOCUMENTS 6,020,047 A * 2/2000 Everhart ................ B41M 3/003
                                                    428/209
6,699,665 B1 * 3/2004 Kim ..................... B01L 3/5025
                                                    435/288.4
6,957,608 B1 * 10/2005 Hubert ................ H01L 51/0021
                                                    101/28
7,547,398 B2 * 6/2009 Schmid .................. B82Y 10/00
                                                    216/26
7,887,736 B2 * 2/2011 Lee ......................... B08B 17/06
                                                    216/100
8,067,265 B2 * 11/2011 Zheng ................. H01L 51/0005
                                                    257/40

(Continued)

FOREIGN PATENT DOCUMENTS

CN       102119363        7/2011
CN       103770487        5/2014
(Continued)

OTHER PUBLICATIONS

Ma, Minglin, and Randal M. Hill. "Superhydrophobic surfaces." Current opinion in colloid & interface science 11.4 (2006): 193-202.*

(Continued)

*Primary Examiner* — Matthew J Daniels
*Assistant Examiner* — Taryn Trace Willett
(74) *Attorney, Agent, or Firm* — JCIPRNET

(57) ABSTRACT

A stamp that is configured to be employed in a printed circuit process, a method of fabricating the stamp, and a printed circuit process are provided, and the stamp includes a main structure, a micro-protrusion structure, and a plurality of nano-conical structures. The micro-protrusion structure is located on the main structure. The nano-conical structures are located on the main structure and surround the micro-protrusion structure.

4 Claims, 3 Drawing Sheets

(56) References Cited

U.S. PATENT DOCUMENTS

| | | | | |
|---|---|---|---|---|
| 8,697,538 B1* | 4/2014 | Chiang | ............... | H01L 21/0338 257/E21.246 |
| 8,895,438 B2* | 11/2014 | Peter | ...................... | B82Y 10/00 264/293 |
| 9,427,908 B2* | 8/2016 | Low | ...................... | B29C 59/022 |
| 2003/0096083 A1* | 5/2003 | Morgan | ................... | B05D 5/08 428/141 |
| 2003/0219992 A1* | 11/2003 | Schaper | ................. | B29C 33/52 438/748 |
| 2005/0003146 A1* | 1/2005 | Spath | ....................... | A63C 5/04 428/105 |
| 2005/0181195 A1* | 8/2005 | Dubrow | ................. | B05D 1/185 428/297.4 |
| 2006/0024504 A1* | 2/2006 | Nelson | .................... | B29C 59/16 428/409 |
| 2007/0157839 A1* | 7/2007 | Kim | ...................... | G02B 5/003 101/483 |
| 2007/0227383 A1* | 10/2007 | Decre | .................... | B82Y 10/00 101/450.1 |
| 2007/0231542 A1* | 10/2007 | Deng | ...................... | B08B 17/06 428/141 |
| 2011/0006032 A1* | 1/2011 | Porro | .................... | H05K 3/061 216/13 |
| 2011/0229667 A1* | 9/2011 | Jin | ...................... | B81C 1/00206 428/34.1 |
| 2013/0075623 A1 | 3/2013 | Cheng et al. | | |

FOREIGN PATENT DOCUMENTS

| | | | |
|---|---|---|---|
| CN | 105102211 | | 11/2015 |
| KR | 20070117134 | A * | 12/2007 |
| TW | 200800635 | | 1/2008 |
| TW | 201210778 | | 3/2012 |
| TW | I390082 | | 3/2013 |

OTHER PUBLICATIONS

Shiu, Jau-Ye, et al. "Fabrication of tunable superhydrophobic surfaces by nanosphere lithography." Chemistry of materials 16.4 (2004): 561-564.*

"Office Action of Taiwan Counterpart Application," dated Feb. 22, 2017, p. 1-p. 5, in which the listed references were cited.

* cited by examiner

STAMP FOR PRINTED CIRCUIT PROCESS AND METHOD OF FABRICATING THE SAME AND PRINTED CIRCUIT PROCESS

TECHNICAL FIELD

The disclosure relates to a stamp, a method of fabricating the same, and a printed circuit process; more particularly, the disclosure relates to a stamp configured to be employed in a printed circuit process, a method of fabricating the stamp, and a printed circuit process.

DESCRIPTION OF RELATED ART

In the existing printed circuit process, stencil transfer-printing applied for mass production achieves better effects than those accomplished by ink jet printing. However, no matter whether the rigid stencil or the flexible stencil obtained through second printing is applied as a stamp and is laid into conductive ink or semiconductor ink, excessive ink is adhered to the recessed surface (i.e., the female face) of the stamp. Hence, in the printed circuit process, the ink on the recessed surface of the stamp is also adhered to the substrate on which the printing process is to be performed, which often leads to errors in the circuit. In the conventional printed circuit process, the resolution of the printed circuit is sacrificed for improving error tolerance of the printed circuit.

Hence, how to prevent excessive ink from being adhered to the recessed surface of the stamp is one of the topics to be discussed and researched.

SUMMARY OF THE DISCLOSURE

The disclosure provides a stamp configured to be employed in a printed circuit process. The stamp has a recessed surface where plural nano-conical structures are located, so as to prevent liquid from being adhered to the recessed surface of the stamp.

The disclosure also provides a method of fabricating a stamp configured to be employed in a printed circuit process. According to the method, plural nano-conical structures are formed on a recessed surface of the stamp, so as to prevent liquid from being adhered to the recessed surface of the stamp.

In an embodiment of the disclosure, a stamp that is configured to perform in a printed circuit process is provided, and the stamp includes a main structure, a micro-protrusion structure, and a plurality of nano-conical structures. The micro-protrusion structure is located on the main structure. The nano-conical structures are located on the main structure and surround the micro-protrusion structure.

According to an embodiment of the disclosure, a width of a bottom portion of each of the nano-conical structures is less than 100 nm.

According to an embodiment of the disclosure, a material of the stamp includes polydimethylsiloxane (PDMS), polymethylmethacrylate (PMMA), polycarbonate (PC), or polyimide (PI).

In an embodiment of the disclosure, a method of fabricating a stamp includes following steps. A substrate is patterned to form a micro-trench in the substrate. Plural nano-pores are formed around the micro-trench in the substrate. A material of the stamp is formed on the substrate, and the micro-trench and the nano-pores are filled with the material. The material of the stamp is separated from the substrate.

According to an embodiment of the disclosure, the step of forming the nano-pores around the micro-trench in the substrate is further described below. A sacrificial layer is formed in the micro-trench. An etching process is performed on the sacrificial layer and the substrate. The sacrificial layer in the micro-trench is removed.

According to an embodiment of the disclosure, the material of the stamp is cured before separating the material of the stamp from the substrate.

According to an embodiment of the disclosure, a method of curing the material of the stamp includes thermal curing, curing under normal temperature, or ultraviolet curing.

According to an embodiment of the disclosure, the material of the stamp includes PDMS, PMMA, PC, or PI.

In an embodiment of the disclosure, a printed circuit process using the stamp described above for forming a circuit pattern on the substrate is provided.

In view of the above, plural nano-conical structures are located on the surface of the main structure of the stamp provided herein, i.e., located on the recessed surface of the stamp, and therefore it is rather difficult for liquid to enter gaps among the nano-conical structures. Thereby, the contact area between the liquid and the nano-conical structures is reduced, and the contact angle is increased, such that the surface of the stamp having the nano-conical structures is a hydrophobic surface (i.e., the so-called lotus effect). As a result, the stamp provided herein can simultaneously have a hydrophilic surface (i.e., the surface having the micro-protrusion structure) and the hydrophobic surface (i.e., the surface having the nano-conical structures). In the subsequent ink-jet printing process, an ink layer is merely formed on the surface having the micro-protrusion structure, and the surface having the nano-conical structures can be protected from the ink due to the lotus effect. When the circuit pattern is printed onto a semiconductor base material, the resolution of the circuit pattern on the base material can be enhanced, and the stability of the process for printing circuit pattern can be improved.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

FIG. 1A to FIG. 1D are schematic cross-sectional views illustrating a method for fabricating a stamp configured to be employed in a printed circuit process according to an embodiment of the disclosure.

Figure 1A:
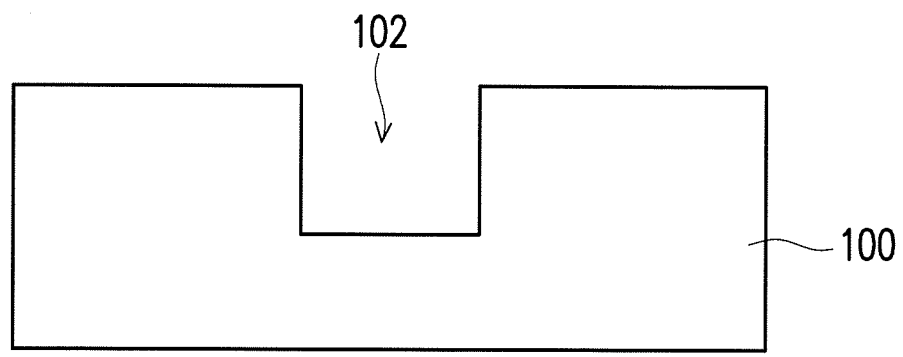
FIG. 1A to FIG. 1D are schematic cross-sectional views illustrating a method for fabricating a stamp configured to be employed in a printed circuit process according to an embodiment of the disclosure.

With reference to FIG. 1A, a substrate 100 is patterned to form a trench 102 in the substrate 100. A method of patterning the substrate 100 includes, for instance, performing a photolithography process and an etching process. A patterned mask layer (not shown) is formed on the substrate 100 to expose a portion of the substrate 100, for instance. The exposed portion of the substrate 100 is etched with use of the patterned mask layer as a mask to form the trench 102. The patterned mask layer is removed. The pattern shape of the trench 102 is the same as the shape of the circuit pattern formed on a substrate applied for imprinting in a subsequent imprinting process. A width of the trench 102 can be controlled by the patterned mask layer, and a depth of the trench 102 can be controlled by the time frame during which the etching process is performed. In the present embodiment, the surface area of the bottom portion of the trench 102 and the depth of the trench 102 are at the micro scale, for instance. In an embodiment of the disclosure, the depth of the trench 102 is from 10 μm to 100 μm, for instance.

Figure 1B:
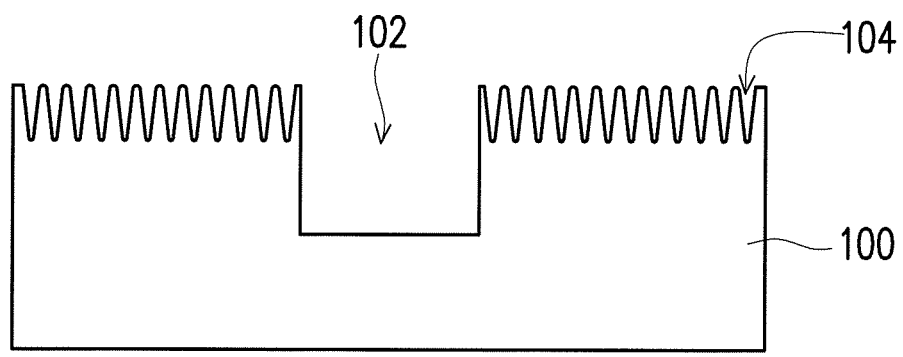

With reference to FIG. 1B, plural pores 104 are formed in the substrate 100 around the trench 102. A method of forming the pores 104 in the substrate 100 around the trench 102 is, for instance, to perform a wet etching process. In an embodiment of the disclosure, the etchant applied in the wet etching process includes metal nanoparticles. Steps of forming the pores 104 in the substrate 100 around the trench 102 are provided below, for instance. The trench 102 of the substrate 100 is filled with a sacrificial layer (not shown), and the substrate 100 is submerged into a solution containing Au nanoparticles. The substrate 100 is etched by the Au nanoparticles, so as to form the pores 104 in the substrate 100. Here, the sacrificial layer is formed in the trench 102 to protect the surface of the trench 102 from being etched by the Au nanoparticles. The sacrificial layer is then removed. The pores 104 are formed by performing the etching process with use of the nanoparticles; hence, the diameter of each pore 104 can be at the nano scale. In an embodiment of the disclosure, a diameter of the top portion of each pore 104 is smaller than 100 nm, for instance. Besides, in an embodiment of the disclosure, the diameter of the top portion of each pore 104 is greater than a diameter of the bottom portion of each pore 104, which should however not be construed as a limitation in the disclosure. In another embodiment of the disclosure, the diameter of the top portion of each pore 104 is substantially equal to the diameter of the bottom portion of each pore 104, for instance. In addition, the depth of each pore 104 can be controlled by the time frame during which the etching process is performed with use of the nanoparticles. In the present embodiment, the depth of the trench 104 is from 0.05 μm to 1 μm, for instance.

Figure 1C:
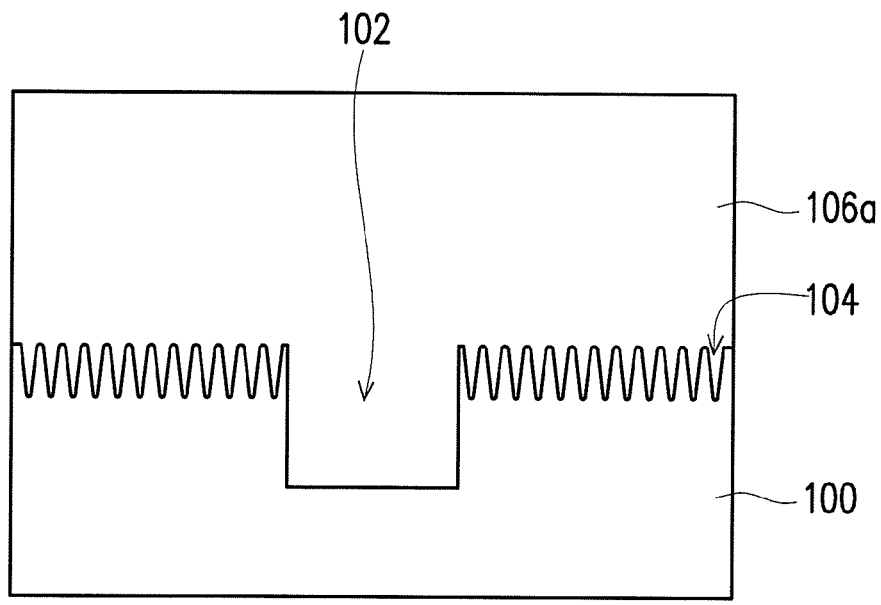

With reference to FIG. 1C, a material 106a of the stamp is forming on the substrate 100, and the trench 102 and the pores 104 are filled with the material 106a of the stamp. Steps of forming the material 106a on the substrate 100 are provided below. A material of the stamp is formed on the substrate 100. The material is a polymer material which may be polydimethylsiloxane (PDMS), polymethylmethacrylate (PMMA), polycarbonate (PC), or polyimide (PI), for instance. After the material is formed on the substrate 100, a pressing process may be selectively performed on the material. Here, the pressing process is performed to effectively fill the trench 102 and the pores 104 with the material. A curing process is performed on the material, so as to form the cured material 106a of the stamp. A method of curing the material of the stamp includes thermal curing, curing under normal temperature, or ultraviolet curing, for instance.

Figure 1D:
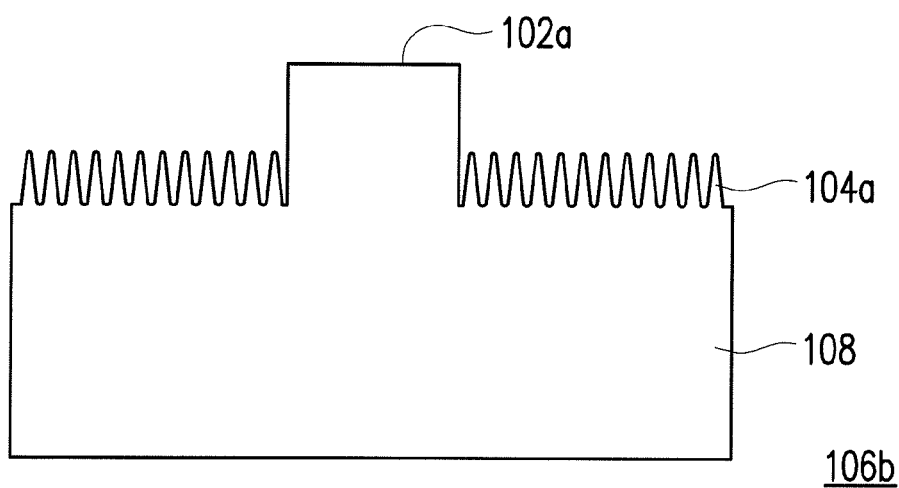

With reference to FIG. 1D, the cured material 106a is separated from the substrate 100, so as to form the stamp 106b. The stamp 106b has a main structure 108, a protrusion structure 102a, and a plurality of conical structures 104a. The main structure 108 is the cured material 106a formed on the substrate 100 but neither formed in the trench 102 nor formed in the pores 104, the protrusion structure 102a is the cured material 106a formed in the trench 102, and the conical structures 104a are the cured material 106a formed in the pores 104. Hence, the pattern shape of the protrusion structure 102a can be defined by the trench 102, such that the pattern shape of the protrusion structure 102a is the same as the shape of the circuit pattern formed on a substrate applied for imprinting in a subsequent imprinting process. As to the arrangement of the components in the stamp 106b, the protrusion structure 102a is located on the main structure 108, and the conical structures 104a are located on the main structure 108 and surround the protrusion structure 102a. The width of the bottom portion of the protrusion structure 102a and the height of the protrusion structure 102a can be controlled by the width of the bottom portion of the trench 102 and the depth of the trench 102, respectively. In the present embodiment, the surface area of the bottom portion of the protrusion structure 102a and the depth of the protrusion structure 102a are at the micro scale, for instance. In an embodiment of the disclosure, the height of the protrusion structure 102a is from 10 μm to 100 μm, for instance. The width of the bottom portion of the conical structures 104a and the height of the conical structures 104a can be controlled by the diameter of the pores 104 and the depth of the pores 104, respectively. Hence, the width of the bottom portion of the conical structures 104a is at the nano scale, for instance. In an embodiment of the disclosure, the width of the bottom portion of each conical structure 104a is smaller than 100 nm, for instance. In an embodiment of the disclosure, the height of the each conical structure 104a is from 0.05 μm to 1 μm, for instance.

Figure 2A:
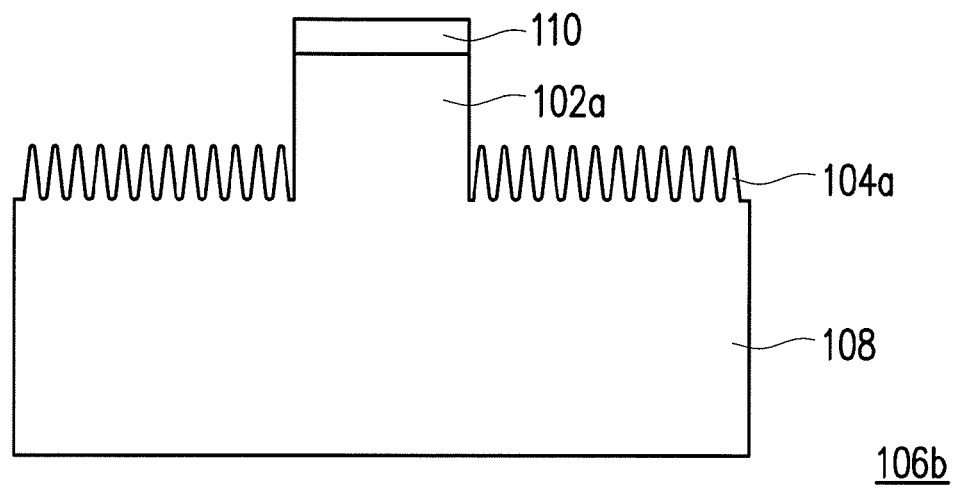
FIG. 2A and FIG. 2B are schematic cross-sectional views illustrating a process of printing a circuit pattern onto a substrate applied for imprinting with use of a stamp configured to be employed in a printed circuit process according to an embodiment of the disclosure.
Figure 2B:
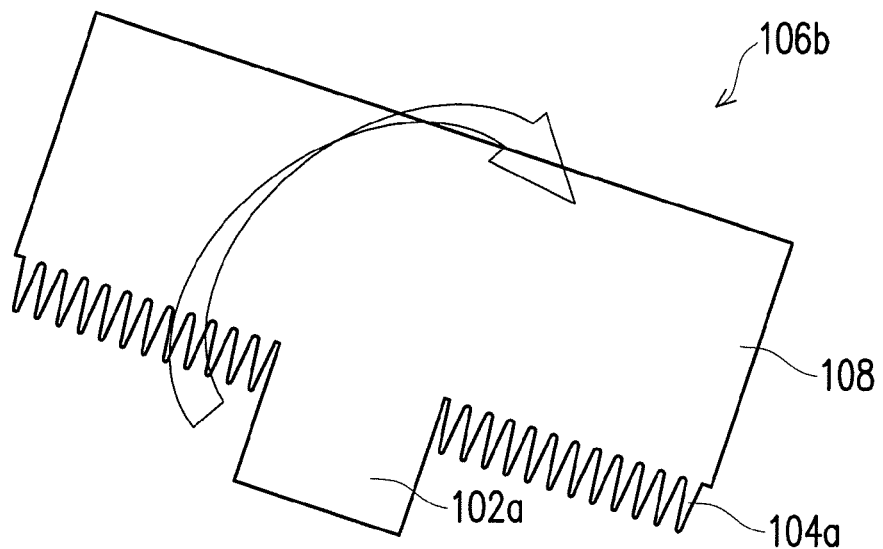
Figure 2B:
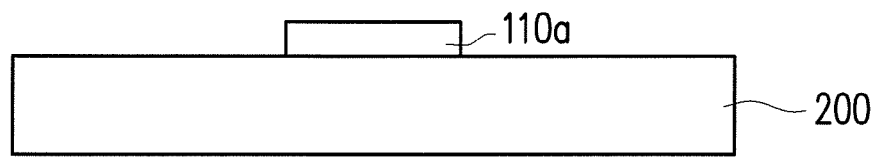

FIG. 2A and FIG. 2B are schematic cross-sectional views illustrating a process of printing a circuit pattern onto a substrate applied for imprinting with use of a stamp configured to be employed in a printed circuit process according to an embodiment of the disclosure.

With reference to FIG. 2A, an ink layer 110 is formed on the protrusion structure 102a of a stamp 106b. In an embodiment of the disclosure, a method of forming the ink layer 110 is, for instance, to perform an ink-jet printing process on the protrusion structure 102a. After the ink-jet printing process is performed on the protrusion structure 102a, the ink layer 110 can be formed on the top surface of the protrusion structure 102a, and no ink layer 110 is formed on the surface of the conical structures 104a of the stamp 106b. This is because the surface of the stamp 106b having the conical structures 104a is a roughened surface with fine recesses and protrusions, and therefore it is rather difficult for ink to enter gaps among the conical structures 104a. Thereby, the contact area between the liquid and the conical structures 104a is reduced, and the contact angle is increased, such that the surface of the stamp 106b having the conical structures 104a is hydrophobic (i.e., the so-called lotus effect).

With reference to FIG. 2B, the surface of the protrusion structure 102a of the stamp 106b where the ink layer 110 is formed is imprinted onto the substrate 200 applied for imprinting, so as to form the circuit pattern. The protrusion structure 102a has the pattern defined by the trench 102; hence, after the surface of the protrusion structure 102a is imprinted onto the substrate 200 applied for imprinting, the circuit pattern can be imprinted onto the surface of the substrate 200 applied for imprinting. Steps of imprinting the surface of the protrusion structure 102a of the stamp 106b (where the ink layer 110 is formed) onto the substrate 200 are described below. The ink layer 110 on the protrusion structure 102a is pressed onto the surface of the substrate 200 applied for imprinting, so as to form an ink layer 110a on the surface of the substrate 200. The stamp 106b is then separated from the substrate 200.

To sum up, the conical structures 140a at the nano scale are located on the surface of the main structure 108 of the stamp 106b provided herein, i.e., located on the recessed surface of the stamp 106b, and therefore it is rather difficult for the ink to enter gaps among the conical structures 104a when the ink-jet process is performed to form the ink layer 110 on the protrusion structure 102a of the stamp 106b. Thereby, the contact area between the ink and the conical structures 104a is reduced, and the contact angle is increased, such that the surface of the stamp 106b having the conical structures 104a is hydrophobic (i.e., the so-called lotus effect). As a result, the stamp 106b provided herein can simultaneously have a hydrophilic surface (i.e., the surface of the stamp 106b having the protrusion structure 102a) and the hydrophobic surface (i.e., the surface of the stamp 106b having the conical structures 104a), and the surface of the stamp 106b having the conical structures 104a can be protected from the ink due to the lotus effect. In the process of printing the circuit pattern onto a semiconductor base material, the resolution of the circuit pattern on the base material can be enhanced, and the stability of the process for printing circuit pattern can be improved.

Although the disclosure has been provided with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A method of fabricating a stamp, comprising:
   patterning a substrate to form a micro-trench in the substrate, where the micro-trench has a depth from 10 µm-100 µm;
   forming a plurality of nano-pores around the micro-trench in the substrate, where the nano-pores have a depth of 0.05 µm-1 µm, comprising:
      forming a sacrificial layer in the micro-trench;
      performing an etching process on the substrate;
      and removing the sacrificial layer; and
   forming a material of the stamp on the substrate, wherein the micro-trench and the nano-pores are filled with the material; and
   separating the material of the stamp from the substrate.

2. The method of claim 1, wherein the material of the stamp is cured before separating the material of the stamp from the substrate.

3. The method of claim 2, wherein a method of curing the material of the stamp comprises thermal curing, curing under normal temperature, or ultraviolet curing.

4. The method of claim 2, wherein the material of the stamp comprises polydimethylsiloxane, polymethylmethacrylate, polycarbonate, or polyimide.

* * * * *